US008789764B2

(12) United States Patent
Park

(10) Patent No.: US 8,789,764 B2
(45) Date of Patent: Jul. 29, 2014

(54) DIAL-MODE TEMPERATURE CONTROLLER THAT FACILITATES CHANGING OF TEMPERATURE RANGE

(75) Inventor: Hwan-Ki Park, Busan (KR)

(73) Assignee: Autonics Corporation, Gyeongsangnam-Do (KR)

( * ) Notice: Subject to any disclaimer, the term of this patent is extended or adjusted under 35 U.S.C. 154(b) by 943 days.

(21) Appl. No.: 12/936,201

(22) PCT Filed: Sep. 8, 2009

(86) PCT No.: PCT/KR2009/005067
§ 371 (c)(1),
(2), (4) Date: Oct. 29, 2010

(87) PCT Pub. No.: WO2010/027234
PCT Pub. Date: Mar. 11, 2010

(65) Prior Publication Data
US 2011/0046756 A1 Feb. 24, 2011

(30) Foreign Application Priority Data

Sep. 8, 2008 (KR) .................... 20-2008-0012165 U
Oct. 24, 2008 (KR) .................... 20-2008-0014129 U

(51) Int. Cl.
| | | |
|---|---|---|
| *B64D 13/00* | (2006.01) | |
| *F24D 19/10* | (2006.01) | |
| *G05D 23/00* | (2006.01) | |
| *H01H 61/00* | (2006.01) | |
| *G05D 23/19* | (2006.01) | |
| *H05K 7/14* | (2006.01) | |
| *H01H 27/10* | (2006.01) | |
| *H01H 19/04* | (2006.01) | |

(52) U.S. Cl.
CPC ................ *G05D 23/19* (2013.01); *H01H 27/10* (2013.01); *H01H 19/04* (2013.01); *H05K 7/1481* (2013.01)
USPC .............................. 236/91 D; 236/94; 337/82

(58) Field of Classification Search
USPC ................ 236/94, 91 D; 700/90; 337/82, 347
See application file for complete search history.

(56) References Cited

FOREIGN PATENT DOCUMENTS

| | | | |
|---|---|---|---|
| JP | 2007-109574 A | | 4/2007 |
| JP | 2007109574 A | * | 4/2007 |
| KR | 10-0452018 | | 10/2004 |
| KR | 20-0402729 | | 12/2005 |
| KR | 20-0405184 | | 1/2006 |
| KR | 20-2008-0001777 | | 6/2008 |
| KR | 2008001777 U | * | 6/2008 |

OTHER PUBLICATIONS

International Search Report mailed Apr. 20, 2010, for International Application No. PCT/KR2009/005067.
English Abstract of KR 10-0452018.
English Language Abstract of JP 2007-109574 A.

* cited by examiner

*Primary Examiner* — Chen Wen Jiang
(74) *Attorney, Agent, or Firm* — Hershkovitz and Associates, PLLC; Abraham Hershkovitz

(57) ABSTRACT

The present invention relates to a dial type temperature controller easily changing a temperature range that is provided with a selector for changing temperature ranges and indication panels for selected corresponding ranges and allows a user to easily change the temperature range without an error, when changing the temperature range and the indication panel, and also stops control output with a dial of the temperature.

2 Claims, 7 Drawing Sheets

(a)  (b)  (c)

DIAL-MODE TEMPERATURE CONTROLLER THAT FACILITATES CHANGING OF TEMPERATURE RANGE

TECHNICAL FIELD

The present invention relates to a dial type temperature controller easily changing a temperature range, and more particularly, to a dial type temperature controller easily changing a temperature range that is provided with a selector for changing temperature ranges and indication panel indicating the ranges and allows a user to easily change the temperature range without an error, when changing the temperature range and the indication panel, and also stops control output with a dial of the temperature controller.

BACKGROUND ART

The dial type temperature controller is a device, which has an input connected with a temperature sensor converting changes in temperature into electric signals and an output connected with a control object to control according to temperature sensed by the temperature sensor in order to allowing setting operation temperature of a control object at reference temperature by turning the dial, and used for devices throughout the industry, including an injector, a mold, an electric furnace, a thermostat, automatic soldering machine.

The dial type temperature controller of the related art generally has a fixed temperature range that can be changed by the temperature controller itself, such that temperature controllers having temperature ranges, for example, 0 to 100° C., 0 to 200° C., 0 to 400° C., 0 to 600° C. etc., are manufactured for specific uses.

Therefore, users have to replace the temperature controllers with other temperature controllers having desired temperature ranges in order to change the temperature ranges.

Meanwhile, in the dial type temperature controllers of the related art, a product has been proposed, of which the values therein should be changed to correspond to desired temperature ranges and the indication panel should be replaced with another one with temperature graduations corresponding to the changed range, in order to change the temperature range of the product. However, in this case, it is required to disassemble the components of the temperature controller and change the values therein by turning the switch of a selector in order to change the range of the temperature controller.

DISCLOSURE

Technical Problem

However, common users have difficulty in changing the structure to change the temperature range of the temperature controller and selecting an indication panel suitable for the changed range. Further, when the users select and use an indication panel that is inappropriate to the changed temperature range by mistake, industrial equipment connected and operated with the temperature controller may be controlled wrong and broken.

Meanwhile, in a control panel having a plurality of panel meters, including a common temperature controller of the related art, devices including the temperature controller and the panel meters are connected with various control objects through one power switch, such that whether to supply power to the control objects is integrally controlled by operating the power switch. In this case, since it is required to turn off the power switch even though operated by only control devices, except for the devices controlled by output from the temperature controller, the operations associated with other panel meters stop, such that it is difficult to selectively control the control objects for desired control objects.

Further, in a temperature controller that maintains the set temperature range when the temperature of control objects is not in the set temperature range, and stops operating when the temperature of the control objects is in the set temperature range, after a reference temperature for controlling the control objects is set by a dial, it is impossible to stop operating, even if the temperature of the control objects is not in the set temperature range.

The present invention has been made to overcome the problems and it is an object of the present invention to provide a dial type temperature controller that makes it possible to simply change the temperature range and replace an indication panel for the changed temperature range on the front of the temperature controller, and also having a function of both setting a temperature range and stopping control output for control object devices.

Technical Solution

In order to accomplish the objects, an exemplary embodiment of the present invention provides a dial type temperature controller easily changing a temperature range includes: a selector that is electrically connected to the front of a PCB module with various electronic circuits for temperature control and selects different temperature ranges by turning step by step; a selector handle that is combined with the selector to turn the selector and has a protrusion on one side to discriminate the temperature ranges; a case that accommodates the PCB module and the selector and is combined with the selector handles through one side; an indicating panel that has protrusion insertion holes at different positions corresponding to the protrusion, for each temperature range selected by turning the selector handle, and is marked with temperature graduations corresponding to the temperature ranges selected by the selector; a dial that is easily detachably inserted to be fitted on a temperature control switch that is turned in electric connection with the front of the PCB module to set temperature within a temperature range set by the selector; and a microcomputer that is programmed to convert a temperature signal corresponding to the amount of turn of the dial into a temperature signal calculated in proportion to a temperature range set by the selector and recognize the converted signal.

Further, the indication panel is marked with a control output stop graduation OFF at the lower limit of the turn of the dial, and the dial type temperature controller further has a switch function that stops the control output by using the microcomputer, when the dial is positioned at the control output stop graduation OFF.

Advantageous Effects

According to the dial type temperature controller easily changing a temperature range of the present invention, it is possible to easily and accurately change temperature ranges of the temperature controller, because it is possible to change the temperature ranges to a desired temperature range by operating a selection switch and easily and accurately replacing an indication panel with an indication panel corresponding to the changed temperature range. Further, it is possible to provide users with wide available ranges and convenience in use, in addition to saving cost relating to and the stock in the manufacturing factory and shops and reducing labor and efforts for managing products.

Further, according to the exemplary embodiments of the present invention, since one temperature controller is provided with a function of setting temperature ranges and stopping control output to the dial of the temperature controller, users can easily stop control output of the temperature controller only by turning the dial to a control output stop graduation OFF marked on the indication panel, and accordingly, it is possible to operate a control object, with the control output of the temperature controller stopped.

BEST MODE

Hereinafter, the configuration and operation of an exemplary embodiment of the present invention will be described in detail with reference to the accompanying drawings.

Figure 1:
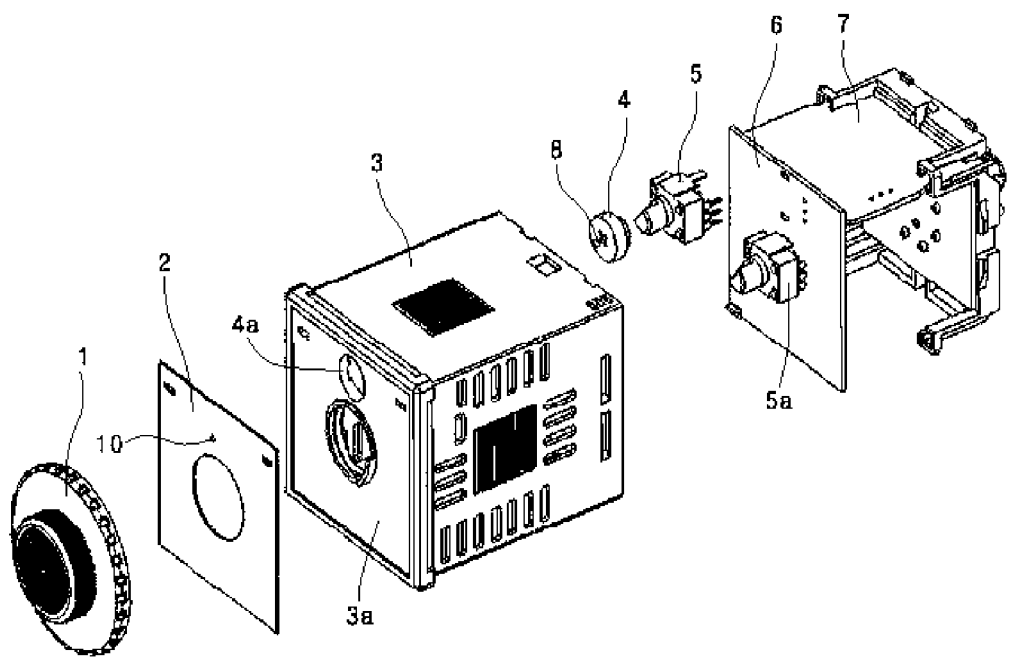
FIG. 1 is an exploded perspective view of a dial type temperature controller according to an exemplary embodiment of the present invention.
Figure 2:
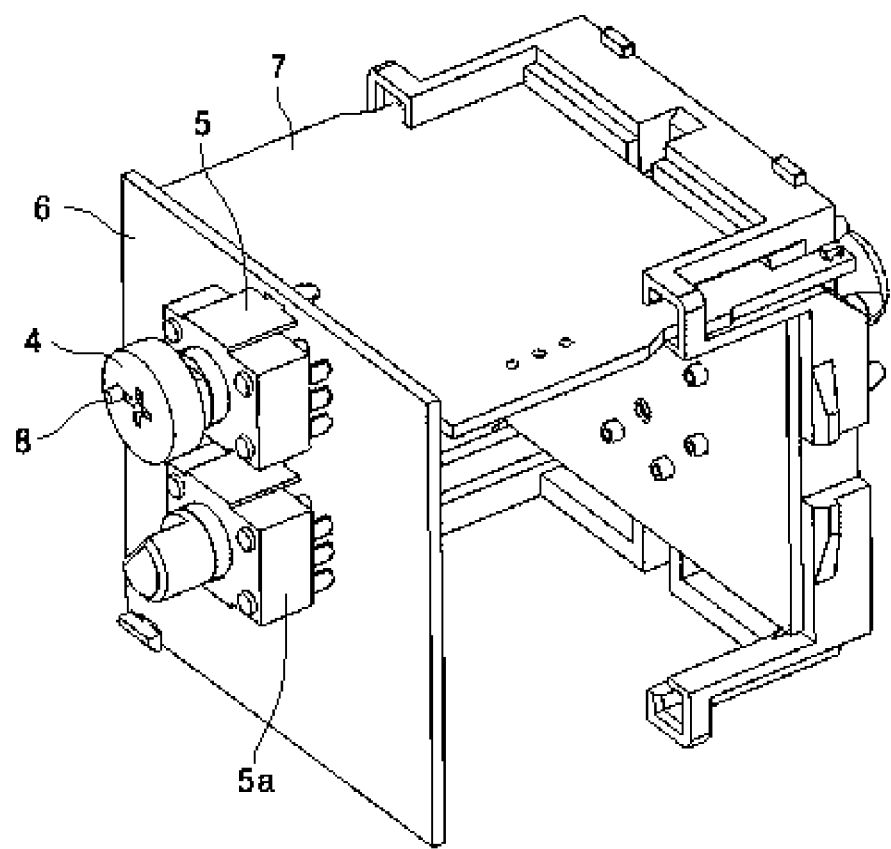
FIG. 2 is a perspective view showing when a selector and a selector handle are attached to the front PCB of a PCB module according to an exemplary embodiment of the present invention.
Figure 3:
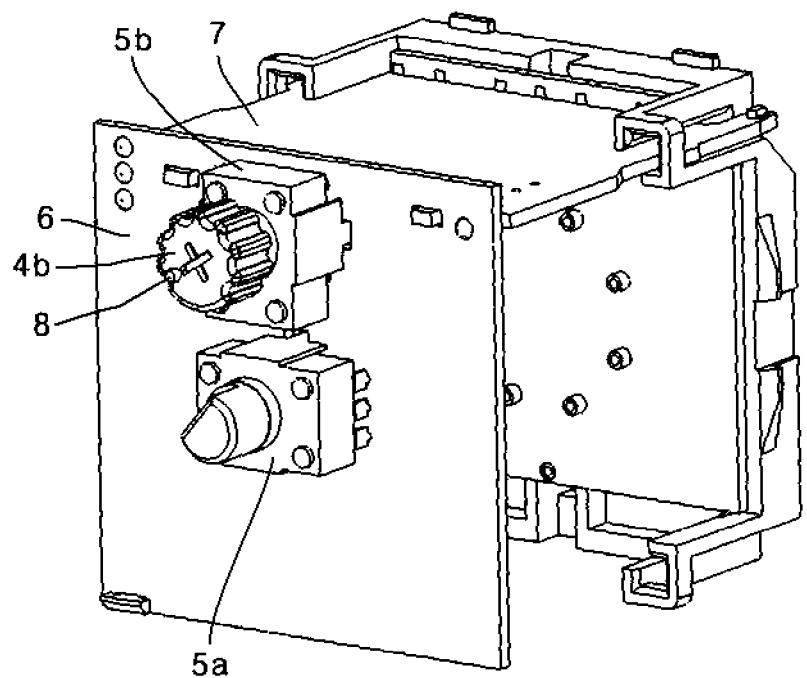
FIG. 3 is a perspective view showing another exemplary embodiment when a volume and a volume handle are attached, instead of the selector and the selector handle, in the exemplary embodiment shown in FIG. 2.
Figure 4:
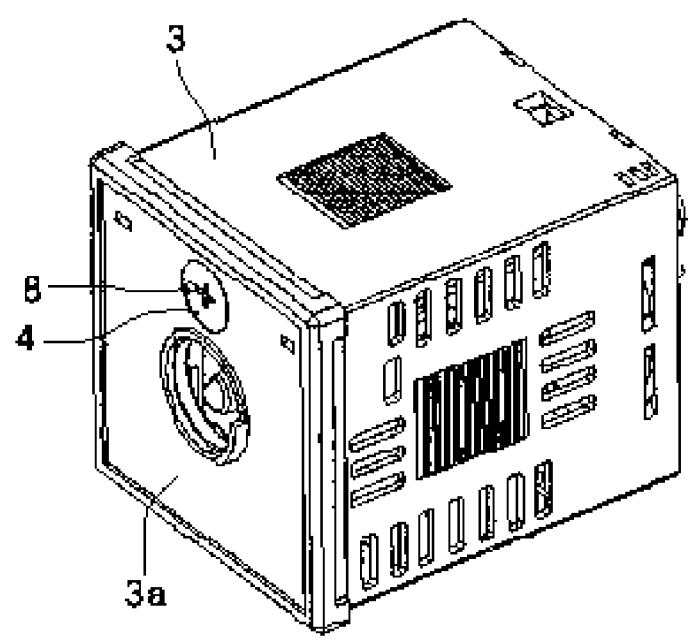
FIG. 4 is a perspective view showing when a case is combined with the PCB module shown in FIG. 2.
Figure 5:
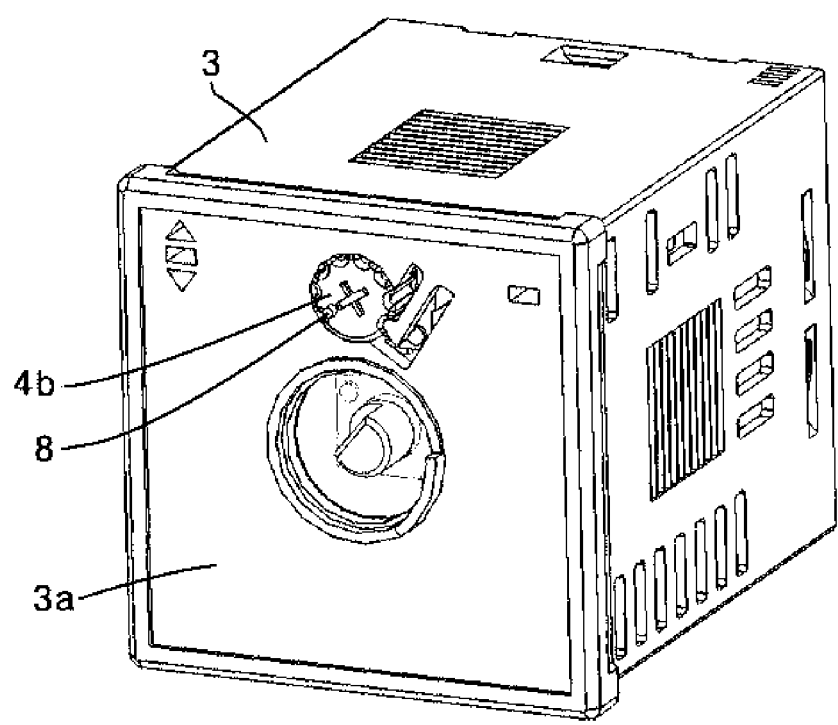
FIG. 5 is a perspective view showing when a case is combined with the PCB module shown in FIG. 3.
Figure 6:
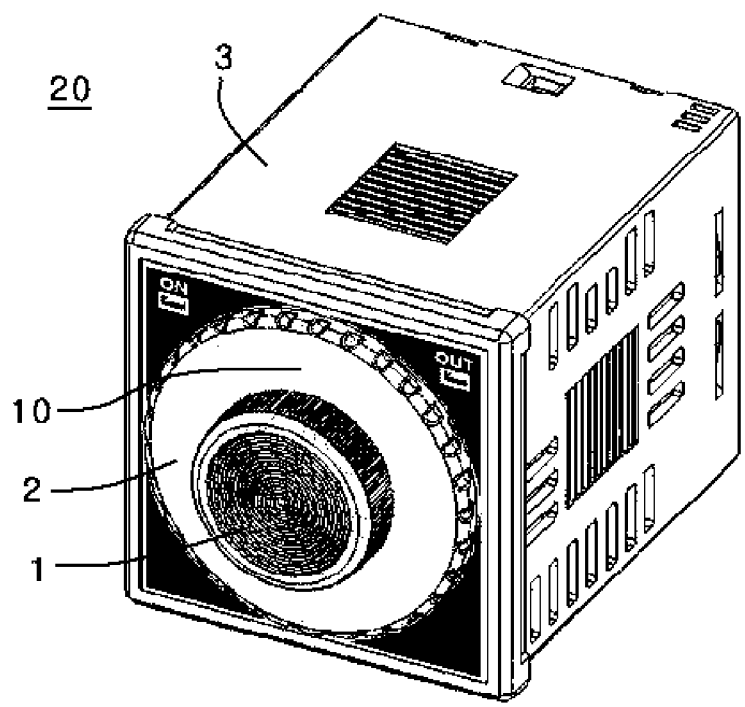
FIG. 6 is a perspective view showing the external appearance of a dial type temperature controller according to an exemplary embodiment of the present invention.
Figure 7:
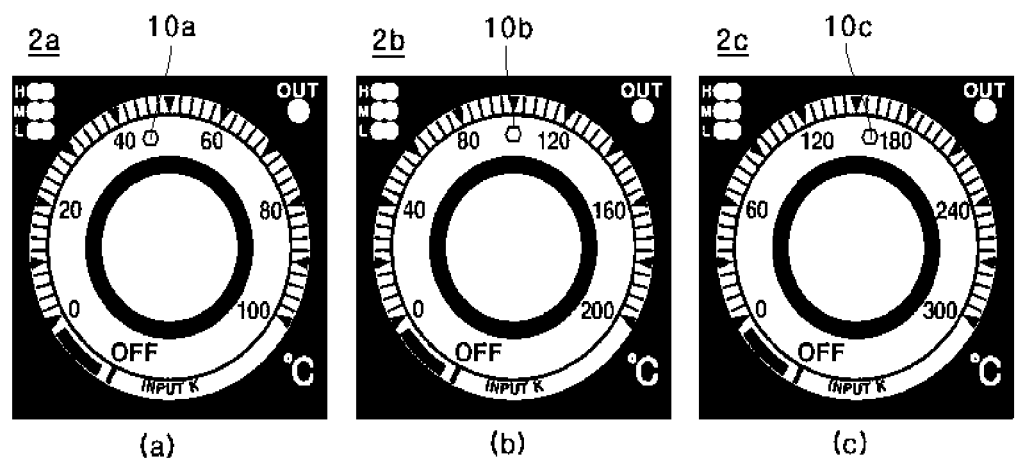
FIG. 7 is a view showing an example of indication panels for each temperature range according to an exemplary embodiment of the present invention.

FIG. 1 is an exploded perspective view of a dial type temperature controller according to an exemplary embodiment of the present invention, FIG. 2 is a perspective view showing when a selector and a selector handle are attached to the front PCB of a PCB module according to an exemplary embodiment of the present invention, FIG. 3 is a perspective view showing when a volume and a volume handle are attached to the front PCB of the PCB module, instead of the selector and the selector handle according to an exemplary embodiment shown in FIG. 2, FIG. 4 is a perspective view showing when a case is combined with the PCB module shown in FIG. 2, FIG. 5 is a perspective view showing when a case is combined with the PCB module shown in FIG. 3, FIG. 6 is a perspective view showing the external appearance of a dial type temperature controller according to an exemplary embodiment of the present invention, and FIG. 7 is a view showing an example of indication panels user for each temperature range according to an exemplary embodiment of the present invention.

In a dial type temperature controller 20 according to an exemplary embodiment of the present invention, a selector 5, which is attached to a front PCB 6 of a PCB module 7 with various electronic circuits for temperature controls in order to allow a user to selectively change a temperature range to a desired range by turning step by step, is electrically connected with a microcomputer 30, and a selector handle 4 is connected to one side of the selector 5 to easily turning the selector 5.

A protrusion 8 for indicating the range is formed on one side of the selector handle 4 to indicate a selected range while the positional angle of the protrusion 8 is changed with reference to the rotational center of the selector handle 4, when the selector handle 4 is turned to change the temperature range.

The PCB module 7, the selector 5, and the selector handle 4 are combined, as shown in FIG. 4, and then accommodated in a case 3, in which the selector handle 4 is inserted in a selector handle hole 4a formed through the front 3a of the case 3.

In this configuration, the protrusion 8 on the selector handle 4, as shown in FIG. 4, is exposed to the outside through the front 3a of the case 3.

FIGS. 3 and 5 show an example replacing the selector 5 and the selector handle 4, which are shown in FIGS. 2 and 3, with a volume 5b and a volume handle 4b, respectively.

There is a structural difference, that is, the selector 5 is designed to select the temperature range step by step while turning, whereas the volume 5b is designed to continuously select temperature ranges while turning; however, the basic principle is the same in that a user can select desired temperature ranges by turning the dial, which shows that the present invention can be implemented in various ways. Therefore, it will be apparent to those skilled in the art that the configuration and operation of the selector 5 and the selector handle 4, which are described hereafter, can be applied in the same way to other embodiments using the volume 5b and volume handle 4b.

Referring to FIGS. 1 and 6, an indication panel 2 marked with sequential temperature graduations is attached to the front 3a of the case 3. When the indication panel 2 is attached to the front 3a of the case 3, the indication panel 2 is in close contact with the front of the selector handle 4 and the protrusion 8 is fitted in a protrusion hole 10 formed in the indication panel 2.

Indication panels 2 with different variable temperature ranges are separately manufactured, as shown in FIG. 7. In (a), (b), and (c) of FIG. 7, an indication panel 2a having a range of 0 to 100° C., an indication panel 2b having a range of 0 to 200° C., and an indication panel 2c having a range of 0 to 300° C. are exemplified, and the indication panels 2a, 2b, and 2c have protrusion holes 10a, 10b, and 10c at different positions, respectively, to discriminate the ranges of the indication panels 2a, 2b, and 2c.

Therefore, when the available temperature range is changed by turning the selector handle 4, the position of the protrusion 8 on the selector handle 4 is correspondingly changed, such that only the indication panel 2 having the protrusion hole 10 at the changed position of the protrusion 8 is locked.

The dial 1 is inserted to be fitted on a temperature control switch 5a at the front of the indication panel 2. It is preferable that the dial 1 and the temperature control switch 5a can be easily attached/detached, without using a specific tool, as shown in the figures. The temperature control switch 5a is electrically connected to a microcomputer 30, on the front PCB 6. Therefore, as the dial 1, that is, the temperature control switch 5a is turned, temperature is set within the temperature range.

When a user separates the dial 1 and the indication panel 2 and turns the selector handle 4 to select a desired range in order to change the available temperature range, the protrusion 8 of the selector handle 4 revolves to the position corresponding to the selected range, in which when the user replaces the indication panel 2 with another indication panel 2 corresponding to the selected temperature range, the protrusion 8 of the selector handle 4 is fitted in the protrusion hole 10 of the indication panel 2.

In the exemplary embodiment, since the protrusion holes 10 of the indication panels 2 are formed at different positions for each selected temperature range, it is impossible to attach an indication panel 2 that does not correspond to the temperature ranges, such that it is possible to basically prevent an error that the user attaches and uses an indication panel 2 that does not fit the selected temperature range.

Meanwhile, the temperature control switch 5a is provided with a switch function of stopping the operation of control objects, in addition to setting temperature for controlling the operation of the control object. That is, when the set position of the temperature control switch 5a is in the temperature range of the indication panel 2, power is supplied and an operation state that maintains set temperature is implemented for a control object out of the set temperature. Further, when the temperature control switch 5a is turned under the minimum available value of the temperature range of the indication panel 2 and positioned to a control output stop graduation OFF, as shown in FIG. 7, the operation of the control object is precluded by cutting the power supplied to the control object from the temperature controller 20, regardless of the temperature of the control object.

Therefore, the user only has to position the temperature control switch 5a to the control output stop graduation OFF in the temperature controller, in order to operate the control object with functions except for the temperature control function. In this case, the other functions of the control object normally operate, with the operation of only the temperature control means stopped, such that it is possible to stop only the temperature control function when temperature control is not needed, and accordingly, it is possible to prevent waste of power due to the temperature control means.

As described above, the user has only to turn the dial 1 combined with the temperature control switch 5a to the temperature stop graduation OFF on the indication panel 2 in order to cut the power that is supplied to the control object from the temperature controller 20, in which the other functions, except for the temperature control function in the control object, are normally operated in response to the off-signal applied to the control object from the temperature controller 20.

Further, although it was exemplified above that the temperature stop graduation OFF is positioned under the minimum available temperature value of the indication panel 2, the temperature stop graduation OFF may be marked at other positions on the indication panel 2. That is, any other modified configurations should be construed as being included in the scope of the present invention, as long as they have a function of stopping only the temperature control means in the control object, in addition to setting operational reference temperature of the control object in one temperature controller 20.

Figure 8:
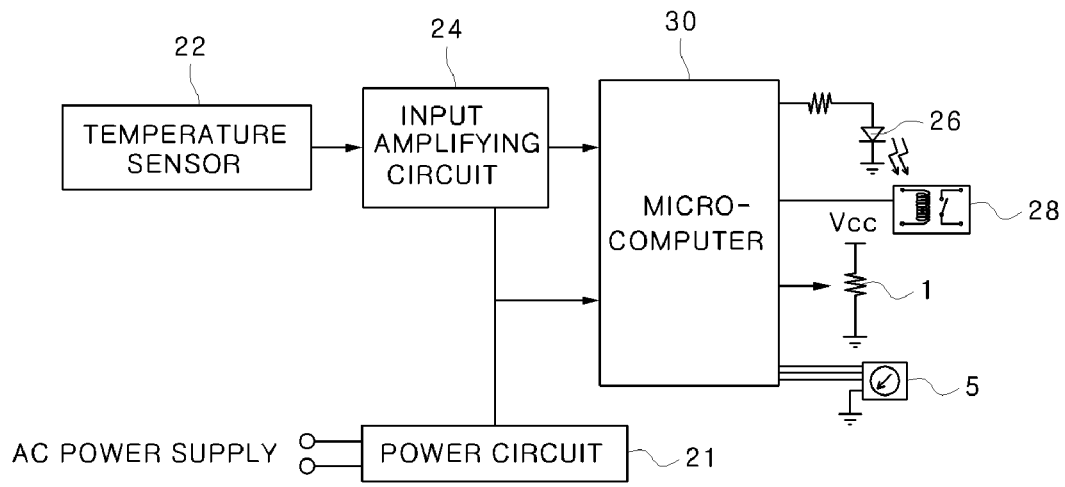
FIG. 8 is a block diagram illustrating a dial type temperature controller according to an exemplary embodiment of the present invention.

FIG. 8 is a block diagram illustrating a dial type temperature controller according to an exemplary embodiment of the present invention.

A dial type temperature controller 20 according to an exemplary embodiment of the present invention includes a built-in microcomputer 30 that controls temperature of industrial equipment which is required to control the temperature.

The microcomputer 30 is programmed to convert a temperature signal corresponding to the amount of turn of the dial 1 into a temperature signal calculated in proportion to a temperature range set by the selector 5 and recognizes the converted signal.

That is, when the temperature ranges set by the selector 5 are different, for example, 0 to 100° C. (first step), 0 to 200° C. (second step), or 0 to 300° C. (third step), the microcomputer 30 is programmed to convert a temperature signal corresponding to the amount of turn of the dial 1 into a temperature signal corresponding to a product of the ratio of the actual amount of turn of the dial 1 to the maximum amount of turn of the dial 1 and the maximum value of the temperature range in each step, and recognizes the converted temperature signal.

Further, the microcomputer 30 outputs a signal for controlling the control object and controls the operation of a relay 28, after comparing a temperature signal set by the operation of the selector 5 and the dial 1, as described above, with a signal received after a temperature signal sensed by the temperature sensor 22 in the control object is amplified through the input amplifying circuit 24.

If the temperature set by the dial 1 is higher than the temperature sensed by the temperature sensor 22, the microcomputer 30 outputs a signal for turning on the relay 28, whereas when the temperature set by the dial 1 is lower than the temperature sensed by the temperature sensor 22, it outputs a signal for turning off the relay 28.

Further, DC power for operating the temperature controller 20 is supplied through the power circuit 21 and an indication lamp 26 is turned on when the dial type temperature controller 20 is in operation such that the operation state can be recognized from the outside.

The present invention is not limited to the exemplary embodiments, but it will be apparent to those skilled in the art that various modification and changes may be made without departing from the scopes and spirits of the present invention.

[Industrial Applicability]

As described above, a dial type temperature controller according to an exemplary embodiment of the present invention allows easy and various changing control temperature ranges of control objects, such as an injector, a mold, an electric furnace, a thermostat, an automatic soldering machine, and normally operate other functions, except for the temperature control function, in the control objects.

The invention claimed is:

1. A dial type temperature controller, comprising:
   a selector that is electrically connected to a front of a PCB module with various electronic circuits for temperature control and sets different temperature ranges by turning step by step;
   a selector handle that is combined with the selector to turn the selector and has a protrusion on one side to discriminate the temperature ranges;
   a case inside which accommodates the PCB module and the selector and which is combined with the selector handle through one side;
   a plurality of indication panels, each having a protrusion insertion hole at a different position corresponding to the protrusion, for each temperature range set by turning the selector handle, and each is marked with temperature graduations corresponding to the temperature ranges selected by the selector;
   a dial that is detachably inserted to be fitted on a temperature control switch that is turned in electric connection with the front of the PCB module to set temperature within a temperature range selected by the selector; and
   a microcomputer that is programmed to convert a temperature signal corresponding to an amount of turn of the dial into a temperature signal calculated in proportion to a temperature range selected by the selector and that recognizes the converted signal.

2. The dial type temperature controller according to claim 1, wherein each indication panel is marked with a control output stop graduation OFF at a lower limit of the turn of the dial, and the dial type temperature controller further has a switch function that stops control output by using the microcomputer, when the dial is positioned at the control output stop graduation OFF.

* * * * *